(12) United States Patent  (10) Patent No.: US 7,732,714 B2
Hammaker et al.  (45) Date of Patent: Jun. 8, 2010

(54) ELECTRICALLY CONDUCTIVE GASKET WITH PAINT MASKING

(75) Inventors: Clark S. Hammaker, Middletown, PA (US); John F. Dietrich, Harrisburg, PA (US)

(73) Assignee: Jemic Shielding Technology, Dauphin, PA (US)

( * ) Notice: Subject to any disclaimer, the term of this patent is extended or adjusted under 35 U.S.C. 154(b) by 0 days.

(21) Appl. No.: 11/293,569

(22) Filed: Dec. 2, 2005

(65) Prior Publication Data

US 2006/0151962 A1  Jul. 13, 2006

Related U.S. Application Data

(60) Provisional application No. 60/636,260, filed on Dec. 15, 2004.

(51) Int. Cl.
*H05K 9/00* (2006.01)

(52) U.S. Cl. ............ 174/357; 174/356; 277/920; 277/924

(58) Field of Classification Search ........ 174/356, 174/357, 366; 277/920, 924
See application file for complete search history.

(56) References Cited

U.S. PATENT DOCUMENTS

| | | | |
|---|---|---|---|
| 3,555,168 A | 1/1971 | Frykberg | |
| 4,414,425 A * | 11/1983 | Bogner | 174/355 |
| 4,857,668 A * | 8/1989 | Buonanno | 174/354 |
| 4,864,076 A | 9/1989 | Stickney | |
| 4,968,854 A | 11/1990 | Benn, Sr. et al. | |
| 5,028,739 A | 7/1991 | Keyser et al. | |
| 5,045,635 A * | 9/1991 | Kaplo et al. | 174/354 |
| 5,068,493 A | 11/1991 | Benn, Sr. et al. | |
| 5,105,056 A | 4/1992 | Hoge, Jr. et al. | |
| 5,107,070 A | 4/1992 | Benn, Sr. et al. | |
| 5,115,104 A * | 5/1992 | Bunyan | 174/356 |
| 5,142,101 A | 8/1992 | Matsuzaki et al. | |
| 5,202,536 A | 4/1993 | Buonanno | |
| 5,250,751 A | 10/1993 | Yamaguchi | |
| 5,578,790 A | 11/1996 | Peregrim | |
| 5,902,956 A | 5/1999 | Spies et al. | |
| 6,204,444 B1 | 3/2001 | Pugliese et al. | |
| 6,248,393 B1 * | 6/2001 | Bunyan et al. | 427/77 |
| 6,525,267 B1 | 2/2003 | Worley et al. | |
| 6,570,755 B2 | 5/2003 | Curlee et al. | |
| 6,613,976 B1 | 9/2003 | Benn, Jr. | |
| 6,621,000 B2 | 9/2003 | Jensen et al. | |
| 6,653,556 B2 | 11/2003 | Kim | |
| 6,818,822 B1 | 11/2004 | Gilliland et al. | |
| 2004/0069515 A1 * | 4/2004 | Norte et al. | 174/35 GC |
| 2005/0202723 A1 * | 9/2005 | Arnold et al. | 439/609 |
| 2006/0103081 A1 | 5/2006 | Dietrich et al. | |

* cited by examiner

*Primary Examiner*—Hung V Ngo
(74) *Attorney, Agent, or Firm*—K&L Gates LLP

(57) ABSTRACT

An electrically conductive gasket for paint masking. In one embodiment of the present invention, the gasket includes a core, an electrically conductive cover that is applied to the core with adhesive. A film of material is attached to the outer surface of the electrically conductive cover which functions as a removable mask. The various embodiments of the gasket may be fabricated from materials capable of withstanding relatively high temperatures and may be provided in a variety of different shapes.

30 Claims, 3 Drawing Sheets

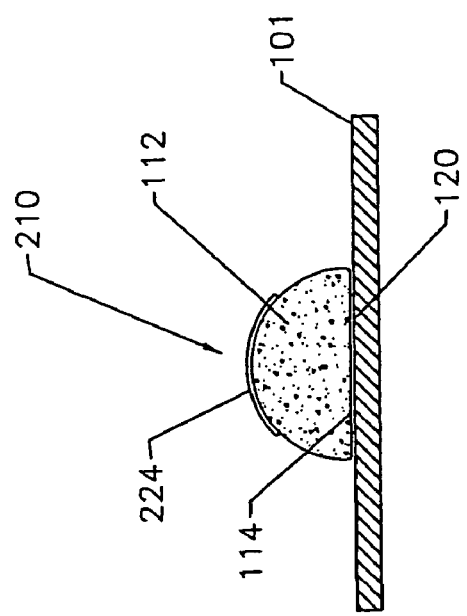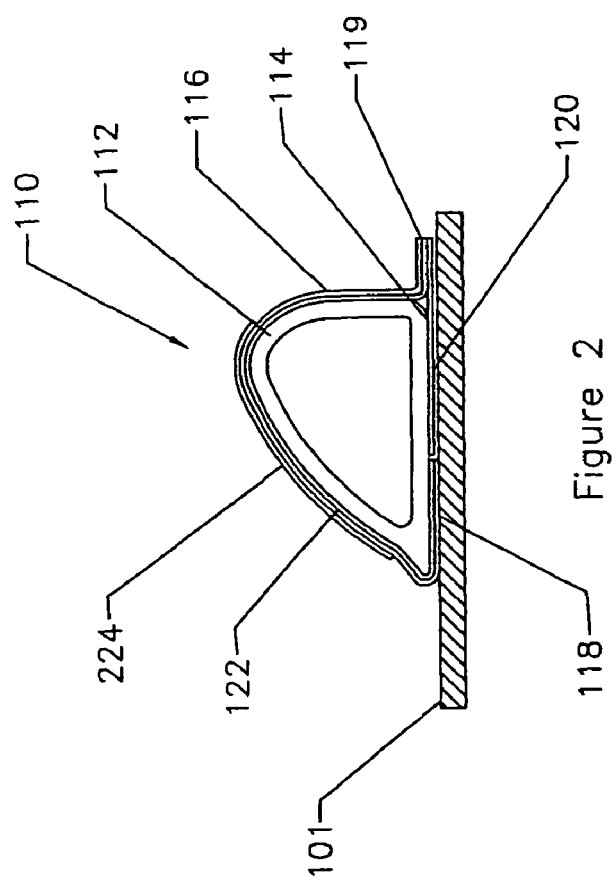

ELECTRICALLY CONDUCTIVE GASKET WITH PAINT MASKING

CROSS REFERENCE TO RELATED APPLICATIONS

This nonprovisional application claims the benefit of U.S. Provisional Application No. 60/636,260, filed Dec. 15, 2004.

BACKGROUND OF THE INVENTION

1. Field of the Invention

Various embodiments of the subject invention relate to gaskets and, to gaskets for inhibiting and preventing leakage of Electromagnetic Interference (EMI) and radio frequency radiation (RFI) with the ability to act as a paint mask.

2. Description of the Invention Background

Ever since Benjamin Franklin flew his famous kite in a lightening storm and discovered electricity, countless numbers of electrically powered devices and components have been developed to make man's life easier. Such components range from, for example, motors, switches, relays, timers, computers, etc. Indeed, the list of electrical components seems endless and continues to grow.

With the development and use of such a myriad of electronic components came additional problems that had to be solved to effectively use such components to achieve desired results. An example of one problem is the occurrence of electromagnetic interference (EMI) that is an undesirable electric disturbance that is induced or radiated from electric or electronic devices. Such EMI problems commonly manifest themselves when several electrical components are located in close proximity to one another wherein the EMI radiating from one-component hampers or debilitates the effective operation of another component mounted nearby.

To combat problems encountered by EMI, electrical components are often placed or often placed or mounted in shielded enclosures that serve to prevent or inhibit the leakage of EMI there from. Such enclosures are commonly made of all metal construction. To prevent or inhibit the leakage of EMI between the doors at their points of connection a variety of gaskets and methods of attaching them have been developed. One type of gasket that has been developed is illustrated in FIG. 1. As shown in this Figure, gasket 1 includes a resilient or flexible core 2 that is covered by an electrically conductive cover 3. The core 2 generally comprises conventional open cell or closed cell foams, rubbers, plastics or metals and the electrically conductive cover 3 may comprise plated fabric (woven, non-woven or knitted), plated plastic, plated rubber, electrically conductive foil, electrically conductive woven wire or electrically conductive wire mesh. These gaskets 1 are commonly affixed to the electrically conductive surface 10, which may comprise a cabinet panel, doorframe, etc. (depending upon the particular application) by adhesive 4 or other fastening medium. To achieve an electrical path the metal surface must be masked prior to painting or coating the unit or the paint or coating must be cleaned off prior to applying the gasket.

Such attachment approaches, however, are time consuming adding labor costs and requiring special precautions when removing the paint. If the cleaning is not complete it can leave an undesirable barrier between the electrically conductive cover material 3 and the electrically conductive surface 10. If a conductive path is not established between the cover material 3 and the conductive surface 10 to which the gasket 1 is attached, the gasket's effectiveness is compromised and, in extreme cases, may be destroyed.

SUMMARY

In accordance with one embodiment of the invention, there is provided a gasket for attachment to an electrically conductive object. One embodiment includes a core that has a perimeter and an attachment portion. An electrically conductive cover that has a first and second end flap is attached to the core by a first adhesive such that the electrically conductive cover extends at least partially around the perimeter of the core and the first and second end flaps are oriented adjacent the attachment portion. A thin film of material is attached to the outer surface of the electrically conductive cover to act as a mask. This film covers the contact surface of the electrically conductive cover and will be removed after painting or coating. Herein, the term "painting or coating" can refer to any surface finishing process including but not limited to high temperature powder coating.

A second adhesive is applied to the attachment portion to affix at least one of the first and second end flaps thereto such that a portion of the second adhesive remains exposed on the attachment portion for attaching the gasket to the electrically conductive object such that at least one of the first and second end flaps are retained in contact with the electrically conductive object.

Another embodiment of the present invention comprises a gasket for attachment to a non-electrical application. This embodiment includes a core that has a perimeter and an attachment portion. A thin film of material is attached to the outer surface of the core. This film covers the contact surface and will be removed after painting or coating. An adhesive may be applied to the attachment portion.

In accordance with another embodiment of the present invention, there is provided a gasket assembly that comprises a core that has a perimeter and an attachment face. An electrically conductive cover member is on at least portion of the core perimeter. A masking material is applied to at least a portion of the electrically conductive cover member on at least a portion of the core perimeter.

In accordance with another embodiment of the present invention, there is provided a method of applying an electrically conductive gasket to an electrically conductive object. In one embodiment, the method comprises applying an electrically conductive material to at least a portion of a perimeter of a core that has an attachment face. The electrically conductive material further forms at least one end flap portion oriented adjacent to the attachment face of the core. The method further includes adhering the attachment face of the core to the electrically conductive object such that the at least one end flap portion of the electrically conductive material that is adjacent to the attachment face contacts the electrically conductive object. In addition, the method further includes applying masking material onto a first portion of the electrically conductive material and applying a coating material to a second portion of the electrically conductive material and at least a portion of the masking material. The method also includes removing the masking material to expose the first portion of the electrically conductive material.

Those of ordinary skill in the art will readily appreciate, however, that these and other details, features and advantages will become further apparent as the following detailed description of the preferred embodiments proceeds.

BRIEF DESCRIPTION OF THE DRAWINGS

In the accompanying Figures, there are shown present preferred embodiments of the invention wherein like reference numerals are employed to designate like parts and wherein:

FIG. 2 is a cross-section view of a gasket assembly embodiment of the present invention after it has been applied to a conductive object such as a housing panel;

FIG. 3 is a cross-section view of another gasket assembly embodiment of the present invention for a non-electrical application;

DETAILED DESCRIPTION

Figure 1:
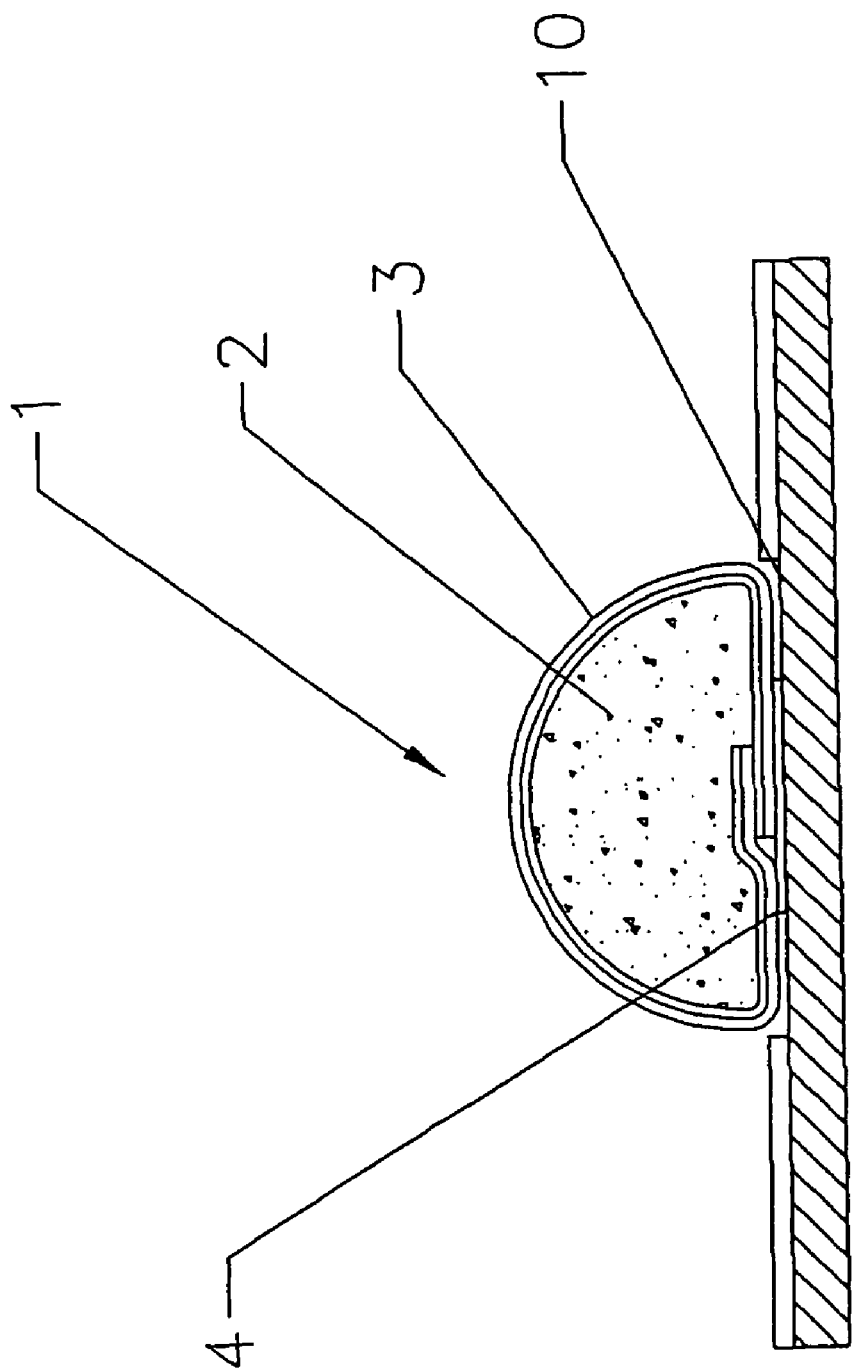
FIG. 1 is a cross-sectional view of a prior gasket design attached to a conductive object such as a housing panel.

Referring now to the drawings for the purposes of illustrating embodiments of the invention only and not for the purposes of limiting the same, FIG. 2 illustrates a gasket assembly 110 comprising one embodiment of the present invention which may be attached to an electrically conductive object 101 such as a portion of a housing used to house electrical components. As the present Detailed Description proceeds, the reader will appreciate that the various embodiments of the present invention may be effectively employed for example, to seal the interface between an enclosure and a door or panel, but various embodiments may also find use in other applications such as providing electrical continuity between two adjoining panels, such as walls in a shielded room, or providing a conductive environmental seal between two adjoining equipment sections. Thus, as used herein, the term "electrically conductive object" can refer to any object that may conduct electricity.

In this embodiment, gasket assembly 110 includes a core 112 which may be hollow (FIG. 2) or solid (FIG. 3). In several alternative embodiments, the core 112 is made from a flexible or relative compressible material such as, for example, various closed and open cell foams such as those closed and open cell foams supplied by, for example, Alloy Extrusion of 4211 Karg Industrial Pkwy, Brimfield, Ohio 44240, rubber, such as that rubber material supplied by Alloy Extrusion of 4211 Karg Industrial Pkwy, Brimfield, Ohio 44240, plastic, such as that plastic material supplied Alloy Extrusion of 4211 Karg Industrial Pkwy, Brimfield, Ohio 44240 or metal, such as that metal core material supplied by Omega Shielding Products of Randolph, N.J. In other embodiments, however, relatively incompressible material or a composite of compressible and incompressible materials (metal, rigid plastic, rubber, etc.) may be employed to form the core 112. For high temperature applications (i.e., temperatures on the order of or in excess of 200° C.), silicone material capable of withstanding such temperatures may be employed. Such material is particularly well-suited for applications wherein the gasket assembly is applied to the panel, object, etc. prior to a powder coating operation. In such application, for example, the gasket is applied prior to coating the panel with powder coating that thereafter must be baked or cured at high temperatures.

Core 112 may be advantageously shaped utilizing conventional manufacturing techniques to fit a particular sealing application. For example, the shape of core 112, when viewed in cross-section, may be D-shaped, square-shaped, rectangular-shaped, P-shaped, L-shaped, U-shaped, O-shaped, teardrop shaped, etc. A variety of different methods are known in the art to form the core in a desired shape. Accordingly, such conventional shaping and core manufacturing methods will not be discussed in great detail herein.

The portion of the core 112 that is adjacent to or constructed for attachment to a conductive object 101 will be referred to herein as the attachment face or attachment portion 114. See FIG. 2. In this embodiment, the attachment portion 114 is attached to the conductive object 101 (cabinet panel, etc.) by adhesive 120 (means for attaching the gasket assembly to a conductive surface). In this embodiment, adhesive 120 comprises a conventional pressure sensitive adhesive, such as that pressure sensitive adhesive manufactured by 3M of St. Paul Minn. Such pressure sensitive adhesive 120 may be double-coated or transfer and is applied to the attachment portion 114 of the core 112 by applying pressure to the adhesive and/or the core 112. In an alternative embodiment, adhesive 120 may comprise a conventional hot melt adhesive, such as that hot melt adhesive manufactured by 3M of St. Paul Minn. Other forms and sources of adhesives pressure sensitive adhesives or hot melt adhesives may be successfully employed. In high temperature applications, adhesives capable of withstanding high temperatures (i.e., temperatures on the order of 200° C. or higher) may be employed. In various gasket assembly embodiments of the present invention, it may not be necessary for the adhesive 120 to have the ability to conduct electrical current. That is, the effectiveness of various embodiments of the present invention do not necessarily rely on the adhesive 120 itself to form an electrically conductive path between the conductive object 110 and the gasket 110. However, electrically conductive pressure sensitive adhesive arrangement or electrically conductive hot melt adhesive arrangements could be employed, if desired.

Also in this embodiment, a portion of the outer perimeter of core 112 is covered with an electrically conductive cover member 116. As used herein, the term "electrically conductive" means the ability to facilitate the passage of an electrical current there through. In this embodiment, electrically conductive cover member 116 may comprise conventional "plated" fabric (woven, non-woven or knitted) such as that plated fabric supplied by Swift Textile of Bloomfield, Conn. The electrically conductive cover member 116 may also be fabricated from plated plastic such as that electrically conductive plated plastic material supplied by Rogers Corporation of 245 Woodstock Road, Woodstock, Conn. 06281, electrically conductive coated rubber such as that electrically conductive plated coated rubber material supplied by Rogers Corporation of 245 Woodstock Road, Woodstock, Conn. 06281, electrically conductive foil such as that conductive foil supplied by Rogers Corporation of 245 Woodstock Road, Woodstock, Conn. 06281, electrically conductive woven wire such as that electrically conductive woven wire manufactured by, for example, Screen Technology Group Inc. of Washougal, Wash. or electrically conductive wire mesh, such as that conductive wire mesh manufactured by, for example, Screen Technology Group Inc. of Washougal, Wash. Again, cover material 116 may comprise electrically conductive material capable of withstanding high temperatures (i.e., temperatures on the order of 200° C. or greater). The foregoing materials are generally supplied in "sheet" form such that they may be cut to a desired length and width and applied to the core 112 in a variety of different manners as will be discussed in further detail below. It is conceivable, however, that the electrically conductive cover 116 may be formed on the perimeter of the core 112 by spraying or otherwise applying a liquid coating that is electrically conductive. With respect to those embodiments specifically employing sheet-like covers, as used herein, the term "sheet-like" refers to materials that are formed in a sheet and which may be cut to length and applied to the core as a continuous sheet and does not refer to those coatings that are sprayed, dipped or otherwise applied in liquid form.

In the embodiment depicted in FIG. 2, the electrically conductive cover material 116 is provided with a desired width such that when wrapped around the core 112, the end flaps 118 and 119 are positioned around the perimeter of the core 112 as shown. In one embodiment, the electrically conductive cover material 116 is affixed to the core 112 by a commercially available adhesive 122. For example, the adhesive 122 may comprise a hot melt type adhesive such as that hot melt adhesive manufactured by 3M of St. Paul, Minn. However, other types and compositions of adhesives may be employed. For example, the adhesive is not electrically conductive. However, electrically conductive adhesives may also be employed to affix the cover material 116 to the core 112, if desired. As can be seen in FIG. 2, a film of masking 224 is applied to the electrically conductive cover 116 in the area of contact. For example the film can be a Mylar film manufactured by Grafix Plastics of Cleveland Ohio.

FIG. 3 illustrates another embodiment of the gasket assembly. Gasket assembly 210 comprises a resilient core 112 as described in FIG. 2, attached to the object 101 (cabinet panel, etc.) by adhesive 120. Such pressure sensitive adhesive 120 may be double-coated or transfer applied to the attachment portion 114 of the core 112 by applying pressure to the adhesive and/or the core 112. A film of masking 224 is applied to the resilient core 116 in the area of contact.

Figure 5:
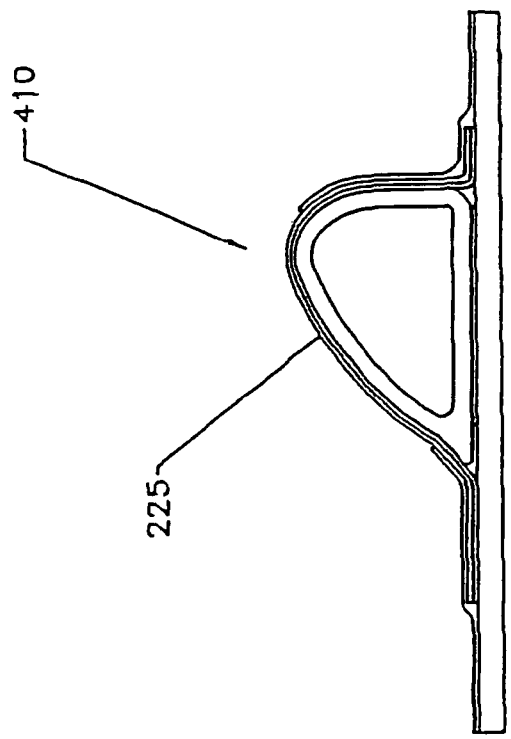
FIG. 5 is a cross-section view of another gasket assembly embodiment of the present invention after it has been applied to a conductive object such as a housing panel and having the masking applied thereto to enable the paint or coating to be removed therefrom.
Figure 4:
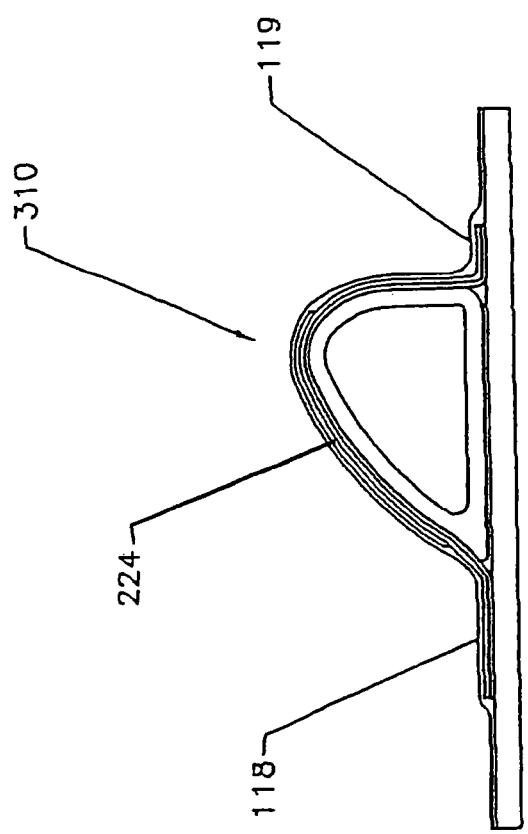
FIG. 4 is a cross-section view of another gasket assembly embodiment of the present invention after it has been applied to a conductive object such as a housing panel and subsequently had the paint or coating applied.

FIGS. 4 and 5 illustrate another embodiment of the gasket assembly as used. FIG. 4 depicts a gasket similar to FIG. 2 in its painted or coated state. This drawing shows the flaps 118 and 119 are adhered to the electrical surface 101 and are coated or painted. This feature seals the gasket to the conductive surface. FIG. 5 shows the gasket of FIG. 4 with the film 224 removed exposing the conductive surface.

The various embodiments of the present invention represent vast improvements over prior gaskets used in applications for controlling electromagnetic interference and improving the application of these gaskets. For example, the ability to apply the gaskets prior to painting or coating permits the end user to seal the conductive path areas and contact surfaces, without the need for special surface treatments or the use of conductive paint mask tapes. It also shortens the assembly time by reducing the need to mask or clean the conductive surface. The present invention will allow the end user to run this gasket through a high temperature environment without degrading the gasket's ability to function and successfully satisfy its intended purpose.

Those of ordinary skill in the art will, of course, appreciate that various changes in the details, materials and arrangement of parts which have been herein described and illustrated in order to explain the nature of the invention may be made by the skilled artisan within the principle and scope of the invention as expressed in the appended claims.

What is claimed:

1. A gasket assembly comprising:
   a core having a perimeter and an attachment face;
   an electrically conductive cover member on at least a portion of said core perimeter; and
   a disposable masking material removably adhered to at least a portion of said electrically conductive cover member on at least a portion of said core perimeter apart from said attachment face to define an electrically conductive contact area such that when said disposable masking material is removed from said at least a portion of said electrically conductive cover member, said contact area is exposed.

2. The gasket assembly of claim 1 wherein said core is fabricated from a material selected from the group of materials consisting of closed cell and open cell foams.

3. The gasket assembly of claim 1 wherein said core is fabricated from a material selected from the group of materials consisting of metal, rigid plastic, and rubber.

4. The gasket assembly of claim 1 wherein said core is substantially hollow.

5. The gasket assembly of claim 1 wherein said core has a cross-sectional shape selected from the group of cross-sectional shapes consisting of D-shapes, square shapes, rectangular shapes, P shapes, L shapes, U shapes, 0 shapes, and tear drop shapes.

6. The gasket assembly of claim 1 wherein said electrically conductive cover member is attached to said core by an adhesive.

7. The gasket assembly of claim 6 wherein said adhesive is electrically conductive.

8. The gasket assembly of claim 6 wherein said adhesive is selected from the group of adhesives consisting of pressure sensitive adhesives and hot melt adhesives.

9. The gasket assembly of claim 8 wherein said electrically conductive material extends around said core perimeter to form at least one electrically conductive end flap adjacent to said attachment face of said core.

10. The gasket assembly of claim 8 wherein said electrically conductive cover comprises material selected from the group of materials comprising electrically conductive plated fabric, electrically conductive coated rubber, electrically conductive woven wire, and electrically conductive wire mesh.

11. The gasket assembly of claim 1 wherein said electrically conductive cover comprises a fluid material that is sprayed onto at least a portion of said core perimeter.

12. A gasket assembly comprising:
    a core having a perimeter and an attachment face;
    a sheet-like electrically conductive cover member having first and second end flaps extending around at least a portion of said core perimeter such that said end flaps are oriented adjacent the attachment face; and
    a masking material removably affixed to at least a portion of said electrically conductive cover member on at least a portion of said core perimeter apart from said attachment face to define an electrically conductive contact area such that when said masking material is removed from said at least a portion of said electrically conductive cover member, said contact area is exposed.

13. The gasket assembly of claim 12 further comprising an adhesive on said first and second end flaps for attaching said first and second end flaps to said core.

14. The gasket assembly of claim 12 further comprising an adhesive between at least a portion of said sheet-like electrically conductive cover member and said at least a portion of said core perimeter.

15. The gasket assembly of claim 12 further comprising:
    adhesive on said first end flap for attaching said first end flap to said attachment face of said core; and
    additional adhesive for attaching said second end flap to said first end flap.

16. The gasket assembly of claim 12 further comprising adhesive on said attachment face of said core for affixing at least one of said first and second end flaps thereto.

17. The gasket assembly of claim 16 wherein some of said adhesive remains exposed on said attachment face for attaching said gasket to an electrically conductive object.

18. The gasket assembly of claim 12 wherein said attachment portion is attached to an electrically conductive object such that at least one of said end flaps is retained in contact with the electrically conductive object.

19. The gasket assembly of claim 18 further comprising a coating on said gasket and at least a portion of said electrically conductive object.

20. The gasket assembly of claim 19 wherein said masking material prevents said coating from adhering to a portion of said electrically conductive cover member.

21. A gasket assembly comprising:
a core having a perimeter and an attachment face;
an electrically conductive cover member extending around said core perimeter to form at least one electrically conductive end flap adjacent to said attachment face of said core; and
a masking material removably affixed to at least a portion of said electrically conductive cover member on at least a portion of said core perimeter apart from said attachment face to define an electrically conductive contact area such that when said masking material is removed from said at least a portion of said electrically conductive cover member, said contact area is exposed.

22. The gasket assembly of claim 21 wherein said core is fabricated from a material selected from the group of materials consisting of closed cell and open cell foams.

23. The gasket assembly of claim 21 wherein said core is fabricated from a material selected from the group of materials consisting of metal, rigid plastic, and rubber.

24. The gasket assembly of claim 21 wherein said core is substantially hollow.

25. The gasket assembly of claim 21 wherein said core has a cross-sectional shape selected from the group of cross-sectional shapes consisting of D-shapes, square shapes, rectangular shapes, P shapes, U shapes, U shapes, 0 shapes, and tear drop shapes.

26. The gasket assembly of claim 21 wherein said electrically conductive cover member is attached to said core by an adhesive.

27. The gasket assembly of claim 26 wherein said adhesive is electrically conductive.

28. The gasket assembly of claim 26 wherein said adhesive is selected from the group of adhesives consisting of pressure sensitive adhesives and hot melt adhesives.

29. The gasket assembly of claim 26 wherein said electrically conductive cover comprises material selected from the group of materials comprising electrically conductive plated fabric, electrically conductive coated rubber, electrically conductive woven wire, and electrically conductive wire mesh.

30. The gasket assembly of claim 21 wherein said electrically conductive cover comprises a fluid material that is sprayed onto at least a portion of said core perimeter.

* * * * *